(12) United States Patent
Sun et al.

(10) Patent No.: US 9,035,335 B2
(45) Date of Patent: May 19, 2015

(54) LIGHT EMITTING MODULE

(71) Applicants: Sheng-Yuan Sun, Tainan (TW); Po-Jen Su, Tainan (TW)

(72) Inventors: Sheng-Yuan Sun, Tainan (TW); Po-Jen Su, Tainan (TW)

(73) Assignee: Genesis Photonics Inc., Tainan (TW)

( * ) Notice: Subject to any disclaimer, the term of this patent is extended or adjusted under 35 U.S.C. 154(b) by 42 days.

(21) Appl. No.: 13/798,126

(22) Filed: Mar. 13, 2013

(65) Prior Publication Data

US 2013/0285083 A1    Oct. 31, 2013

(30) Foreign Application Priority Data

Apr. 26, 2012  (TW) .............................. 101114933 A

(51) Int. Cl.
| | |
|---|---|
| *H01L 27/15* | (2006.01) |
| *H01L 25/075* | (2006.01) |
| *H01L 33/20* | (2010.01) |
| *H01L 33/50* | (2010.01) |

(52) U.S. Cl.
CPC ............ *H01L 27/15* (2013.01); *H01L 25/0753* (2013.01); *H01L 33/20* (2013.01); *H01L 33/50* (2013.01)

(58) Field of Classification Search
CPC ..................... H01L 2924/12041; H01L 33/48; H01L 33/58; H01L 33/502; H01L 33/504; H01L 2933/0041; H01L 25/167; H01L 27/156

USPC .................................. 257/79–103; 438/22–47
See application file for complete search history.

(56) References Cited

U.S. PATENT DOCUMENTS

| | | | |
|---|---|---|---|
| 7,213,940 B1* | 5/2007 | Van De Ven et al. | 362/231 |
| 2009/0050908 A1* | 2/2009 | Yuan et al. | 257/88 |
| 2010/0140633 A1* | 6/2010 | Emerson | 257/88 |
| 2011/0309390 A1* | 12/2011 | Liu et al. | 257/89 |
| 2012/0068198 A1* | 3/2012 | Andrews et al. | 257/88 |

OTHER PUBLICATIONS

Cree, Inc., Cree Binning & Labeling "Cree® XLamp® MC-E LED", Sep. 9, 2011, p. 9.*

* cited by examiner

*Primary Examiner* — Peniel M Gumedzoe
(74) *Attorney, Agent, or Firm* — Jianq Chyun IP Office

(57) ABSTRACT

A light emitting module including a substrate, a plurality of first light emitting diode (LED) chips and a plurality of second LED chips is provided. The substrate has a cross-shaped central region and a peripheral region surrounding the cross-shaped central region. The first LED chips are disposed on the substrate and at least located in the cross-shaped central region. The second LED chips are disposed on the substrate and at least located in the peripheral region. A size of each second LED chip is smaller than a size of each first LED chip. The number of the first LED chips located in the peripheral region is smaller than that in the cross-shaped central region. The number of the second LED chips located in the cross-shaped central region is smaller than that in the peripheral region.

12 Claims, 3 Drawing Sheets

LIGHT EMITTING MODULE

CROSS-REFERENCE TO RELATED APPLICATION

This application claims the priority benefit of Taiwan application serial no. 101114933, filed on Apr. 26, 2012. The entirety of the above-mentioned patent application is hereby incorporated by reference herein and made a part of this specification.

BACKGROUND OF THE INVENTION

1. Technical Field

The invention relates generally to a light emitting module, and more particularly to a light emitting module using a light emitting diode chip as the light source.

2. Related Art

A light emitting diode (LED) is a light emitting element constituted by a semiconductor material having group III-V elements. The LED has advantages such as long service life, small volume, high shock resistance, low heat output, and low power consumption. Thus, it has been widely utilized in indicators or light sources for household appliances and various instruments. In recent years, the LED has been developed towards multicolor and high brightness; therefore, its application scope has been expanded to large outdoor display boards, traffic signal lights, and the like. In the future, the LED may even become the main illumination light source with both power-saving and environment-protecting functions.

In the designs of conventional LED modules, the light beam emitted by the LED chip is projected directly. In other words, the light beam generated by the LED chip has high directivity, and thus may result in unfavorable light uniformity and glares that would cause discomfort for the user. Moreover, in order to generate the white LED light source, typically a plurality of LED chips of different colors (e.g. red, blue, and green) with the same size are configured in an array on the carrier for packaging. However, as the light from these LEDs is emitted forward directly, a large light mixing area is needed to harmonize the light. The size of the whole LED module is increased as a consequence, which causes inconvenience.

To resolve the aforementioned problems, an optical lens is usually configured in the current LED modules, so that the light beam emitted by the LED chips can be utilized effectively. However, when the LED chips are covered by the optical lens, due to light of different color having different refraction angles with the optical lens, the illumination angle generated by the whole LED illumination module may be too small or focused at a certain region. For example, a part of the red light appears at a specific range, such that the distribution of chroma for the entire illumination regions becomes irregular, and thereby the LED module may have problems such as non-uniform light or low color render index of the light source.

SUMMARY OF THE INVENTION

The invention provides a light emitting module integrating a plurality of light emitting diode (LED) chips of different size, and the light emitting module is capable of improving the problem of non-uniform chroma in the conventional LED module.

The invention provides a light emitting module including a substrate, a plurality of first LED chips, and a plurality of second LED chips. The substrate has a cross-shaped central region and a peripheral region surrounding the cross-shaped central region. The first LED chips are disposed on the substrate and at least located in the cross-shaped central region. The second LED chips are disposed on the substrate and at least located in the peripheral region. A size of each second LED chip is smaller than a size of each first LED chip. The number of the first LED chips located in the peripheral region is smaller than the number of the first LED chips located in the cross-shaped central region. The number of the second LED chips located in the cross-shaped central region is smaller than the number of the second LED chips located in the peripheral region.

According to an embodiment of the invention, a dominant wavelength of the first LED chips is in a wavelength range of a specific color light, and a difference between the dominant wavelengths of at least two first LED chips is greater than or equal to 5 nm.

According to an embodiment of the invention, the first LED chips are blue LED chips having dominant wavelengths of 440-480 nm.

According to an embodiment of the invention, a dominant wavelength of the second LED chips is in a wavelength range of a specific color light, and a difference between the dominant wavelengths of at least two second LED chips is greater than or equal to 5 nm.

According to an embodiment of the invention, the second LED chips are red LED chips having dominant wavelengths of 600-760 nm.

According to an embodiment of the invention, the light emitting module further includes a lens disposed on the substrate and at least covering 70% of a total area occupied by the first LED chips and the second LED chips on the substrate.

According to an embodiment of the invention, an exterior shape of the lens includes a circular shape or an oval shape.

According to an embodiment of the invention, the light emitting module further includes a plurality of fluorescent layers respectively disposed on the first LED chips and the second LED chips.

According to an embodiment of the invention, a length of each first LED chip is L1, a length of each second LED chip is L2, and $L2 \leq L1/\sqrt{2}$.

According to an embodiment of the invention, the light emitting module further includes a plurality of third LED chips disposed on the substrate and at least located in the peripheral region, in which a size of each third LED chip is smaller than the size of each second LED chip, and the number of the third LED chips located in the cross-shaped central region is smaller than the number of the third LED chips located in the peripheral region.

According to an embodiment of the invention, a length of each first LED chip is L1, a length of each third LED chip is L3, and $L3 \leq L1/2$.

According to an embodiment of the invention, a dominant wavelength of the third LED chips is in a wavelength range of a specific color light, and a difference between the dominant wavelengths of at least two third LED chips is greater than or equal to 5 nm.

According to an embodiment of the invention, the third LED chips are green LED chips having dominant wavelengths of 500-560 nm.

According to an embodiment of the invention, the first LED chips, the second LED chips, and the third LED chips are blue LED chips having dominant wavelengths of 440-480 nm.

According to an embodiment of the invention, the third LED chips are a plurality of flip-chip LED chips.

According to an embodiment of the invention, the first LED chips are a plurality of flip-chip LED chips.

According to an embodiment of the invention, the second LED chips are a plurality of flip-chip LED chips.

In summary, the design of the light emitting module according to some embodiments of the invention disposes a plurality of large size LED chips in the cross-shaped central region, and disposes a plurality of small size LED chips in the peripheral region. Therefore, the corner regions can be effectively used to optimize the utilization rate of the substrate. Moreover, the LED chips with the small size can supplement the chroma performance of the LED chips with the large size. Accordingly, the light emitting module can achieve favorable chroma uniformity.

Several exemplary embodiments accompanied with figures are described in detail below to further describe the disclosure in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
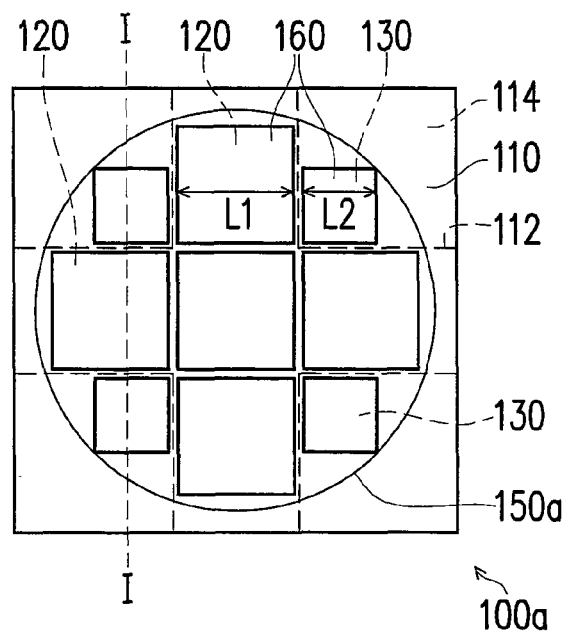
FIG. 1A is a schematic top view of a light emitting module according to an embodiment of the invention.
Figure 1B:
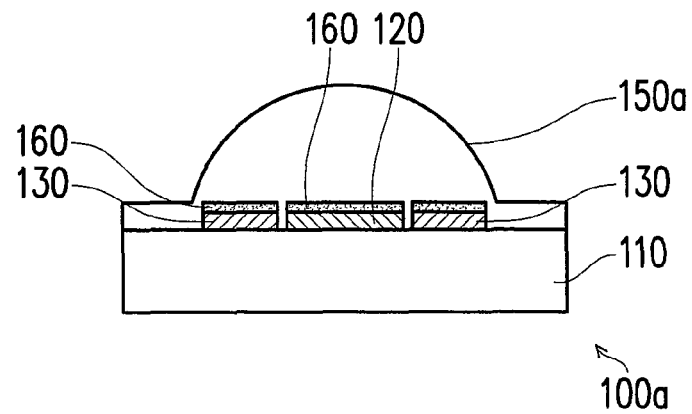
FIG. 1B is a schematic cross-sectional view taken along line I-I in FIG. 1A.

FIG. 1A is a schematic top view of a light emitting module according to an embodiment of the invention. FIG. 1B is a schematic cross-sectional view taken along line I-I in FIG. 1A. With reference to FIGS. 1A and 1B, a light emitting module 100a includes a substrate 110, a plurality of first light emitting diode (LED) chips 120, and a plurality of second LED chips 130.

In more detailed, the substrate 110 has a cross-shaped central region 112 and a peripheral region 114 surrounding the cross-shaped central region 112. The first LED chips 120 are disposed on the substrate 110 and at least located in the cross-shaped central region 112. Herein, the first LED chips 120 are electrically connected to the substrate 110, and the first LED chips 120 are flip-chip LED chips, for example. The second LED chips 130 are disposed on the substrate 110 and at least located in the peripheral region 114. Herein, the second LED chips 130 are electrically connected to the substrate 110, and the second LED chips 130 are flip-chip LED chips, for example.

To be specific, a size of each second LED chip 130 is smaller than a size of each first LED chip 120. The number of the first LED chips 120 located in the peripheral region 114 is smaller than the number of the first LED chips 120 located in the cross-shaped central region 112. Moreover, the number of the second LED chips 130 located in the cross-shaped central region 112 is smaller than the number of the second LED chips 130 located in the peripheral region 114. In other words, a majority of the large size first LED chips 120 is located in the cross-shaped central region 112, and a majority of the small size second LED chips 130 is located in the peripheral region 114. Herein, a length of each first LED chip 120 is L1, a length of each second LED chip 130 is L2, and preferably $L2 \leq L1/\sqrt{2}$.

Specifically, a dominant wavelength of the first LED chips 120 is in a wavelength range of a specific color light. Moreover, the first LED chips 120 are blue LED chips having dominant wavelengths of 440-480 nm. In the present embodiment, a difference between the dominant wavelengths of at least two first LED chips 120 is greater than or equal to 5 nm, such that an inventory issue of the first LED chips 120 can be mitigated and an inventory cost can be reduced. A dominant wavelength of the second LED chips 130 is in a wavelength range of a specific color light. Moreover, the second LED chips 130 are red LED chips having dominant wavelengths of 600-760 nm. In the present embodiment, a difference between the dominant wavelengths of at least two second LED chips 130 is greater than or equal to 5 nm, such that an inventory issue of the second LED chips 130 can be mitigated and an inventory cost can be reduced.

In addition, the light emitting module 100a of the present embodiment further includes a lens 150a and a plurality of fluorescent layers 160. Specifically, the lens 150a is disposed on the substrate 110 and at least covers 70% of a total area occupied by the first LED chips 120 and the second LED chips 130 on the substrate 110. As shown in FIGS. 1A and 1B, the lens 150a in the present embodiment completely covers the first LED chips 120 and the second LED chips 130. An exterior shape of the lens 150a is formed by a circular lens portion and a planar portion, in which the circular lens portion completely covers the first LED chips 120 and the second LED chips 130. The fluorescent layers 160 are respectively and directly disposed on the first LED chips 120 and the second LED chips 130 for enhancing a light emitting efficiency of the first LED chips 120 and the second LED chips 130.

The design of the light emitting module 100a in the present embodiment disposes the large size first LED chips 120 in the cross-shaped central region 112 of the substrate 110, and disposes the small size second LED chips 130 in the peripheral region 114 of the substrate 110. Therefore, the second LED chips 130 (e.g. red LED chips) with the small size and longer wavelengths can supplement a chroma performance of the first LED chips 120 (e.g. blue LED chips) with the large size and shorter wavelengths, and thereby form a white light with favorable uniformity. Accordingly, the light emitting module 100a can achieve favorable chroma uniformity. Furthermore, in the present embodiment, the arrangement of the different sized first LED chips 120 and second LED chips 130 may match a geometric shape of the lens 150a. That is, the smaller second LED chips 130 can be disposed at corner locations on the substrate 110 corresponding to the lens 150a. Accordingly, besides optimizing a utilization rate of the substrate 110 by effectively using the corner regions, the chroma uniformity of the light emitting module 100a can be enhanced.

It should be noted that, the embodiments hereafter adopt the same or similar reference labels used in the previous embodiments to represent the same or the like elements, and the description of the same technical content is omitted. The omitted description can be referenced to the previous embodiments, and so further elaboration thereof is not repeated.

Figure 2:
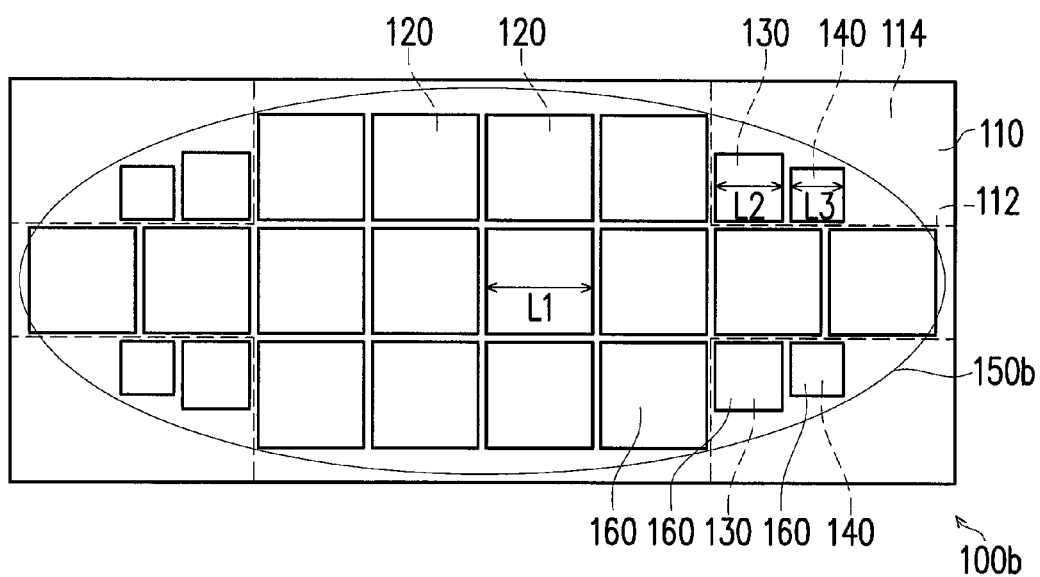
FIG. 2 is a schematic top view of a light emitting module according to an embodiment of the invention.

FIG. 2 is a schematic top view of a light emitting module according to an embodiment of the invention. Referring to FIG. 2, a light emitting module 100b of the present embodiment is similar to the light emitting module 100a depicted in FIG. 1A. A difference between the two light emitting modules resides in that, an exterior shape of a lens 150b of the light emitting module 100b in the present embodiment is oval, and the light emitting module 100b further includes a plurality of third LED chips 140. The third LED chips 140 are disposed on the substrate 110 and at least located in the peripheral region 114. The number of the third LED chips 140 located in the cross-shaped central region 112 of the substrate 110 is smaller than the number of the third LED chips 140 located in the peripheral region 114. In other words, a majority of the third LED chips 140 is located in the peripheral region 114. Herein, the fluorescent layers 160 are directly disposed on the third LED chips 140.

As shown in FIG. 2, the lens 150b in the present embodiment completely covers the first LED chips 120, the second LED chips 130, and the third LED chips 140. A size of each third LED chip 140 is smaller than a size of each second LED chip 130, and the third LED chips 140 are flip-chip LED chips, for example. A length of each first LED chip 120 is L1, a length of each third LED chip 140 is L3, and preferably L3≤L1/2. A dominant wavelength of the third LED chips 140 is in a wavelength range of a specific color light. Moreover, the third LED chips 140 are green LED chips having dominant wavelengths of 500-560 nm. That is, the dominant wavelengths of the third LED chips 140 are longer than the dominant wavelengths of the first LED chips 120. Moreover, a difference between the dominant wavelengths of at least two third LED chips 140 is greater than or equal to 5 nm, such that an inventory issue of the third LED chips 140 can be mitigated and an inventory cost can be reduced.

The design of the light emitting module 100b in the present embodiment disposes a plurality of large size first LED chips 120 in the cross-shaped central region 112 of the substrate 110, and disposes a plurality of small size second LED chips 130 and third LED chips 140 in the peripheral region 114 of the substrate 110. Therefore, the second LED chips 130 (e.g. red LED chips) and the third LED chips 140 (e.g. green LED chips) can supplement a chroma performance of the first LED chips 120 (e.g. blue LED chips). Accordingly, the light emitting module 100b can achieve favorable chroma uniformity. Moreover, besides the arrangement of the first LED chips 120, the second LED chips 130, and the third LED chips 140 optimizing a utilization rate of the substrate 110 by effectively using the corner regions of the substrate 110 corresponding to the lens 150b, the chroma uniformity of the light emitting module 100b can be enhanced.

Figure 3A:
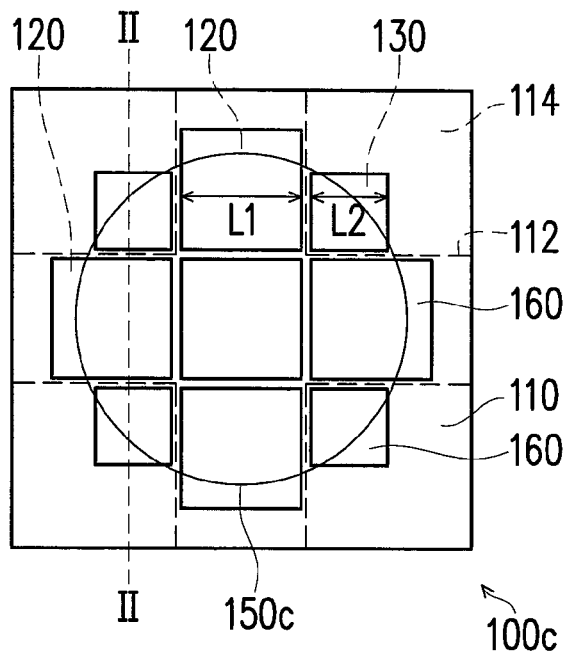
FIG. 3A is a schematic top view of a light emitting module according to an embodiment of the invention.
Figure 3B:
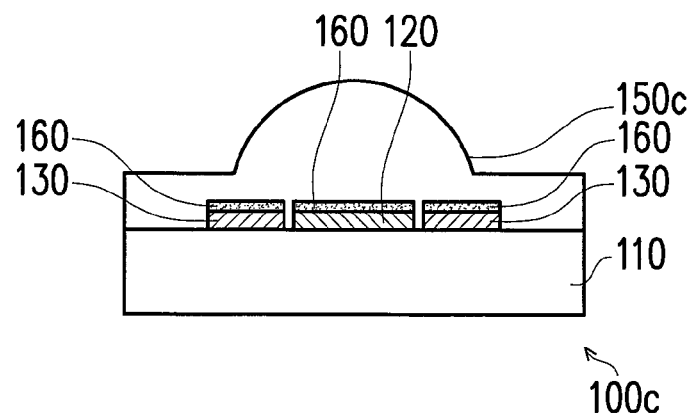
FIG. 3B is a schematic cross-sectional view taken along line II-II in FIG. 3A.

FIG. 3A is a schematic top view of a light emitting module according to an embodiment of the invention. FIG. 3B is a schematic cross-sectional view taken along line II-II in FIG. 3A. Referring to FIGS. 3A and 3B, a light emitting module 100c of the present embodiment is similar to the light emitting module 100a depicted in FIG. 1A. A difference between the two light emitting modules resides in that, a lens 150c of the present embodiment does not completely cover the first LED chips 120 and the second LED chips 130. Specifically, an exterior shape of the lens 150c is formed by a circular lens portion and a planar portion, in which the circular lens portion does not completely cover the first LED chips 120 and the second LED chips 130. The lens 150c at least covers 70% of a total area occupied by the first LED chips 120 and the second LED chips 130 on the substrate 110.

Since a majority of the regions covered by the lens 150c is located in the cross-shaped central region 114 of the substrate 110, which is where the first LED chips 120 are located, therefore, when the area covered by the lens 150c is smaller than the total area occupied by the first LED chips 120 and the second LED chips 130 on the substrate 110, the overall light emitting efficiency and the chroma uniformity of the light emitting module 100c are not affected.

It should be noted that, the exterior shape of the lenses 150a, 150b, and 150c are not limited in invention. Although the exterior shapes of the lenses 150a, 150b, and 150c herein specifically refers to circular and oval shapes, however other known structural designs capable of achieving the same light mixing effect, such as a continuous arc for the exterior shape of the lens, is still a part of the technical proposal of the present application and does not depart from the scope of protection sought by the present application.

In view of the foregoing, the design of the light emitting module according to some embodiments of the invention disposes the large size LED chips in the cross-shaped central region, and disposes the small size LED chips in the peripheral region. Therefore, the LED chips with the small size and longer wavelengths can supplement the chroma performance of the LED chips with the large size and shorter wavelengths. Accordingly, the light emitting module can achieve favorable chroma uniformity. Furthermore, according to some embodiments of the invention, the arrangement of the different sized LED chips may match the geometric shape of the lens. That is, the smaller LED chips can be disposed at corner locations on the substrate corresponding to the lens. Accordingly, besides optimizing the utilization rate of the substrate by effectively using the corner regions, the chroma uniformity of the light emitting module can be enhanced.

Although the invention has been described with reference to the above embodiments, it will be apparent to one of ordinary skill in the art that modifications to the described embodiment may be made without departing from the spirit of the invention. Accordingly, the scope of the invention will be defined by the attached claims not by the above detailed descriptions.

What is claimed is:

1. A light emitting module, comprising:
   a substrate having a cross-shaped central region and a peripheral region surrounding the cross-shaped central region;
   a plurality of first light emitting diode (LED) chips disposed on the substrate and at least located in the cross-shaped central region, wherein a dominant wavelength of the first LED chips is in a wavelength range of a specific color light, and a difference between the dominant wavelengths of at least two first LED chips is greater than or equal to 5 nm, and the first LED chips are blue LED chips having dominant wavelengths of 440-480 nm; and
   a plurality of second LED chips disposed on the substrate and at least located in the peripheral region, wherein a size of each second LED chip is smaller than a size of each first LED chip, the number of the first LED chips located in the peripheral region is smaller than the number of the first LED chips located in the cross-shaped central region, and the number of the second LED chips located in the cross-shaped central region is smaller than the number of the second LED chips located in the peripheral region, a dominant wavelength of the second LED chips is in a wavelength range of a specific color light, and a difference between the dominant wavelengths of at least two second LED chips is greater than or equal to 5 nm, the second LED chips are red LED chips having dominant wavelengths of 600-760 nm.

2. The light emitting module as claimed in claim 1, further comprising a lens disposed on the substrate and at least covering 70% of a total area occupied by the first LED chips and the second LED chips on the substrate.

3. The light emitting module as claimed in claim 2, wherein an exterior shape of the lens comprises a circular shape or an oval shape.

4. The light emitting module as claimed in claim 1, further comprising a plurality of fluorescent layers respectively disposed on the first LED chips and the second LED chips.

5. The light emitting module as claimed in claim 1, wherein a length of each first LED chip is L1, a length of each second LED chip is L2, and $L2 \leq L1/\sqrt{2}$.

6. The light emitting module as claimed in claim 1, further comprising a plurality of third LED chips disposed on the substrate and at least located in the peripheral region, wherein a size of each third LED chip is smaller than the size of each second LED chip, and the number of the third LED chips located in the cross-shaped central region is smaller than the number of the third LED chips located in the peripheral region.

7. The light emitting module as claimed in claim 6, wherein a length of each first LED chip is L1, a length of each third LED chip is L3, and $L3 \leq L1/2$.

8. The light emitting module as claimed in claim 6, wherein a dominant wavelength of the third LED chips is in a wavelength range of a specific color light, and a difference between the dominant wavelengths of at least two third LED chips is greater than or equal to 5 nm.

9. The light emitting module as claimed in claim 6, wherein the third LED chips are green LED chips having dominant wavelengths of 500-560 nm.

10. The light emitting module as claimed in claim 6, wherein the third LED chips are a plurality of flip-chip LED chips.

11. The light emitting module as claimed in claim 1, wherein the first LED chips are a plurality of flip-chip LED chips.

12. The light emitting module as claimed in claim 1, wherein the second LED chips are a plurality of flip-chip LED chips.

* * * * *